United States Patent
Chandrashekar et al.

(10) Patent No.: US 10,911,274 B2
(45) Date of Patent: Feb. 2, 2021

(54) METHODS AND APPARATUS FOR WIDEBAND AND FAST CHIRP GENERATION FOR RADAR SYSTEMS

(71) Applicant: Intel Corporation, Santa Clara, CA (US)

(72) Inventors: Kailash Chandrashekar, Hillsboro, OR (US); Ashoke Ravi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/586,418

(22) Filed: Sep. 27, 2019

(65) Prior Publication Data

US 2020/0028722 A1  Jan. 23, 2020

(51) Int. Cl.
| | |
|---|---|
| *H04L 27/00* | (2006.01) |
| *H04L 27/10* | (2006.01) |
| *H04L 27/152* | (2006.01) |
| *H03M 1/82* | (2006.01) |
| *H03M 1/68* | (2006.01) |

(52) U.S. Cl.
CPC ............ *H04L 27/103* (2013.01); *H03M 1/68* (2013.01); *H03M 1/822* (2013.01); *H04L 27/1525* (2013.01); *H04L 2027/0016* (2013.01)

(58) Field of Classification Search
CPC ............... H04L 27/103; H04L 27/1525; H04L 2720/0016; H03M 1/68; H03M 1/822
See application file for complete search history.

(56) References Cited

U.S. PATENT DOCUMENTS

| | | | |
|---|---|---|---|
| 2002/0158814 A1* | 10/2002 | Bright | G02B 27/017 345/7 |
| 2005/0110552 A1* | 5/2005 | Vu | H03L 7/0995 327/333 |
| 2010/0120384 A1* | 5/2010 | Pennec | H03F 1/0261 455/126 |
| 2018/0167056 A1* | 6/2018 | Bauernfeind | H03H 17/0635 |

\* cited by examiner

*Primary Examiner* — Ted M Wang
(74) *Attorney, Agent, or Firm* — Hanley, Flight & Zimmerman, LLC

(57) ABSTRACT

Methods, apparatus, systems and articles of manufacture for wideband and fast chirp generation for radar systems are disclosed herein. An example apparatus includes a phase digital-to-analog converter to convert a digital input that specifies at least one of a phase modulation or a frequency modulation into an analog output, and to generate a phase modulated output centered on an intermediate frequency. The example apparatus also includes a frequency multiplier to frequency multiply the phase modulated output centered on the intermediate frequency by a multiplication factor to generate a chirp signal.

22 Claims, 10 Drawing Sheets

METHODS AND APPARATUS FOR WIDEBAND AND FAST CHIRP GENERATION FOR RADAR SYSTEMS

FIELD OF THE DISCLOSURE

This disclosure relates generally to radar systems, and, more particularly, to methods and apparatus for wideband and fast chirp generation for radar systems.

BACKGROUND

Radio detection and ranging (radar) systems utilize radio frequency (RF) waves to detect a position and/or velocity of an object. Radar is commonly used in systems used for detecting locations and/or movement of objects (e.g., aircraft, cars, trucks, boats, spacecraft, weather, etc.) Radar systems typically include a transmitter that emits RF signals. The RF signals reflect off of the tracked object and return to a receiver of the radar system. Differences in the transmitted and received RF signals can be analyzed to identify the position, velocity, etc. of the object.

BRIEF DESCRIPTION OF THE DRAWINGS

The figures are not to scale. In general, the same reference numbers will be used throughout the drawing(s) and accompanying written description to refer to the same or like parts.

Figure 1:
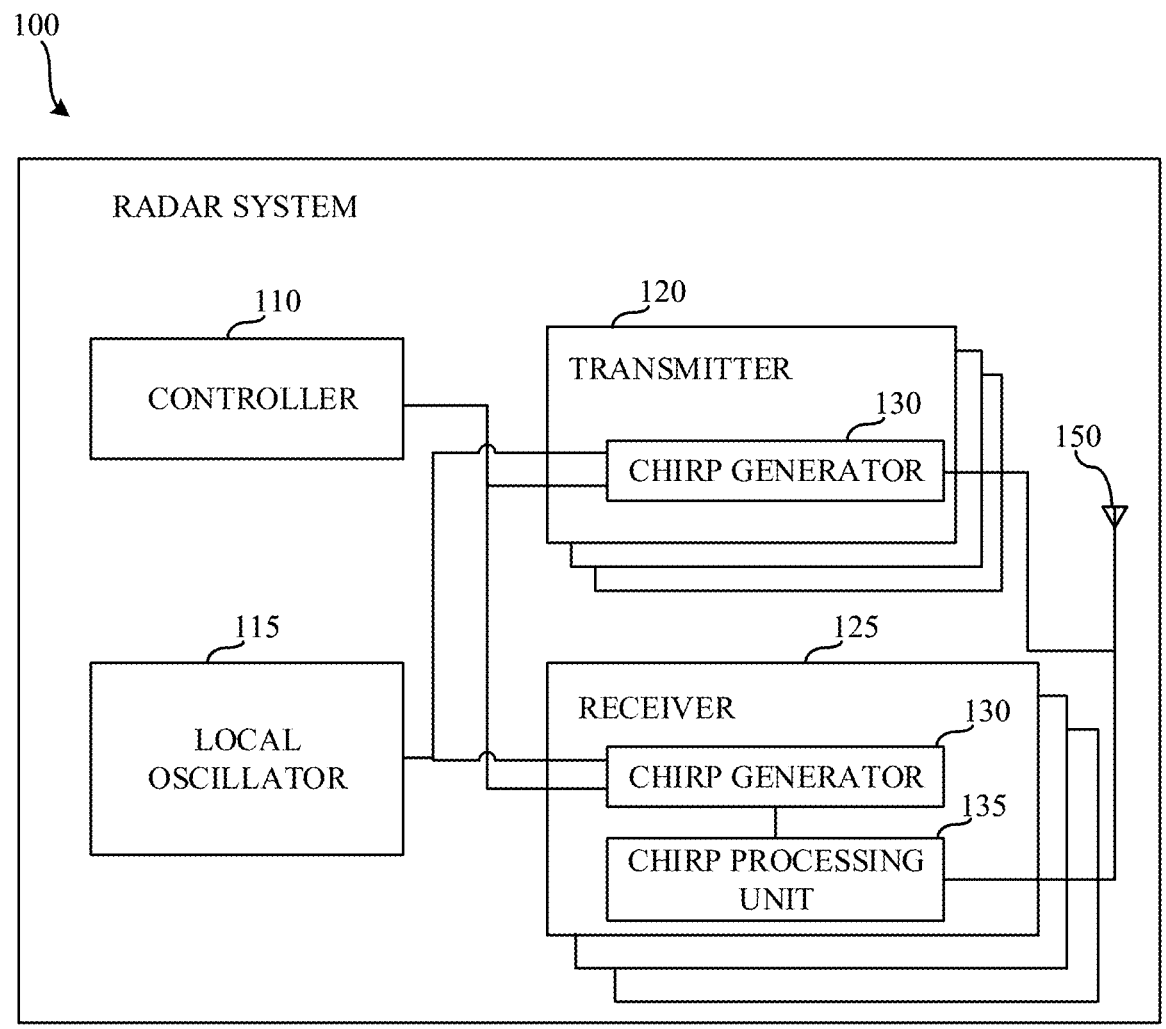
FIG. 1 is a schematic illustration of a multi-input multi-output (MIMO) radar system implemented in accordance with the teachings disclosed herein.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Radar systems typically require the generation of a frequency-modulated continuous wave (FMCW) chirp signals whose bandwidth (BW) determines the range resolution and duration determines the Doppler (velocity) resolution. As range and velocity resolution requirements increase, so do the bandwidth requirements for a chirp generation circuit, which is reflected in the complexity and power consumption of the system.

Tight phase alignment between the transmitters and receivers of a radar system is important for accuracy of the system. Tight alignment is also especially challenging in multiple input, multiple output (MIMO) radar systems. Generating a common chirp signal and distributing it to multiple transmitters and/or receivers (Tx/Rx) with picosecond alignment accuracy increases the system/platform complexity and reduces the flexibility to independently modulate different Tx/Rx. Phase alignment calibration locally in each Tx/Rx would also operates with a modulated signal across a wide bandwidth.

Existing approaches typically involve the use of a phase locked loop (PLL) based architecture, or a digital to analog converter (DAC) based architecture. In the prior PLL-based architecture a PLL generates a chirped fixed frequency reference LOref (typically with a center frequency of ~20 gigahertz (GHz)) that is then distributed to multiple Tx/Rx units where LOref is locally multiplied up to the 80 GHz band with or without phase modulation. In the prior DAC-based architecture, a fixed LOref is distributed to multiple Tx/Rx and, at each Tx/Rx, chirp signals are generated locally using high-speed DACs.

In the PLL-based architecture, the modulated LOref must be distributed with careful matching to maintain phase alignment between the different Tx/Rx units. Calibrating for any phase misalignment requires the error measurement circuitry to operate with a LOref that is varying in frequency, which increases the calibration complexity.

In the PLL-based architecture, the Rx architecture is restricted to using a modulated LOref to generate the required radio-frequency local oscillator (RF LO) signal to drive the mixers (represented as LORF) by using a frequency multiplier (referred to as analog dechirp), and loses the flexibility to down-convert the RF signal with a fixed ~80 GHz LORF and apply the dechirp in the digital baseband.

In the PLL-based architecture, in the Tx, this scheme restricts the ability to maintain orthogonality between the multiple Tx units. For example, if orthogonality is to be achieved by staggering the transmitted signals in time, then RF phase shifters or delays are required on the ~20 GHz LOref which utilize large amounts of power, degrade noise performance, and are difficult to implement in a manner that provides known and accurate phase shifts. For orthogonality, by staggering transmitted signals in frequency, each transmitter would require an additional circuit (like a fractional PLL) to apply a unique frequency shift on the LOref.

In the PLL-based architecture, since the PLL is a closed-loop system with bandwidth limitations, scaling this architecture to generate chirps in shorter durations <10 us in order to increase Doppler range of the radar system would require higher PLL bandwidths and additional bandwidth enhancement techniques (such as 2-point modulation). This places significant burdens on the LOref generation since this would need to be achieved without degradation of other PLL specifications like phase noise.

In a DAC-based architecture, each Tx/Rx receives a LOref at a fixed frequency and chirps can be generated locally through the use of DACs. In the transmitter, DACs are clocked synchronous to the LOref and are used to generate a chirp at direct current (DC) or some low intermediate frequency (low-IF). The LORF is created by driving the LOref through a frequency multiplier. The DAC signals are then up-converted around LORF using mixers providing the desired chirp signal. This scheme has the advantage of providing a single, fixed frequency (LOref) to each Tx/Rx, which is easier to phase align, while providing the flexibility to locally generate orthogonal chirps in the Tx and chirps or fixed-frequency shifts in the Rx (analog and digital dechirp support). However, this architecture also places certain constraints on the DAC bandwidth. For instance, in order to generate a chirp bandwidth (BW) of 4 GHz, the DAC bandwidth must be 4 GHz if using "real" signal processing (i.e., a single mixer driven by the DAC signal and LORF) or, with complex signal processing, two DACs with 2 GHz bandwidth each are required to drive IQ mixers.

In the DAC-based architecture, to provide the flexibility and features that make this architecture advantageous over the PLL-based architecture, each Tx/Rx would require high-speed DACs and RF mixers (either single high-speed DAC or two quadrature DACs with half the bandwidth). This is very costly in terms of power consumption and area of the radar system.

Example approaches disclosed herein utilize a phase DAC for wideband, fast, and flexible chirp generation for radar systems. In examples disclosed herein, the phase DAC represents a digital-to-analog converter where the digital input is modulated so as to provide an analog signal which has its phase modulated (as per a digital input), and not its amplitude. This is in contrast to a traditional DAC, which has the ability to modulate both the amplitude and phase of a signal. In examples disclosed herein, the phase DAC does not allow for amplitude modulation. In other words, the term "phase DAC" is used to indicate that the analog output of the DAC has only its phase modulated, and not its amplitude. In examples disclosed herein, the phase DAC operates off of a fixed frequency (LOref), creates the desired phase modulation (a FMCW chirp, fixed frequency shift, phase modulation like Binary Phase-shift keying (BPSK), Gaussian frequency shift keying (GFSK), etc., constant phase shift, etc.) centered around LOref, and then drives a frequency multiplier to generate the final desired LORF. This enables significant lowering of the bandwidth and memory requirements of the baseband saving power and physical area, and reduces the cost of implementing it in multiple Tx/Rx.

Examples disclosed herein utilize a chirp generation architecture operating in the approximately 76-81 GHz band that generates wideband FMCW and phase modulated chirp(s). In examples disclosed herein, the chirp(s) cover at least approximately 5 GHz of bandwidth, and have chirp durations of approximately 10 us or less. However, other bandwidth and/or durations may additionally or alternatively be achieved. In examples disclosed herein, all transmitters and receivers are aligned to a fixed frequency reference (LOref). In this manner, each transmitter and/or receiver can be modulated locally, enabling additional coding to be placed on top of the synchronized chirps. Such coding enables distinction of the various chirps that may be emitted in close time and/or space proximity to each other (e.g., when multiple radar systems might interfere with one another). This enables MIMO operation since all the Tx can be modulated orthogonally while in each Rx, the LOref can either be (1) passed through as is, modulated to generate a chirp, or (2) shifted by a known frequency and/or phase. Examples disclosed herein these features while improving the radar system efficiency, as the bandwidth and memory requirements from the component circuitry are lowered. The power and area savings allow for the Phase DAC to be implemented in the multiple Tx and Rx, and allows for a software defined radar system that can support different modulations schemes without architecture and circuit redesign.

FIG. 1 is a schematic illustration of an example of a multi-input, multi-output (MIMO) radar system 100. The example radar system 100 of FIG. 1 includes a controller 110, a local oscillator 115, one or more transmitter(s) 120, one or more receiver(s) 125, and an antenna 150. Each of the transmitter(s) 120 and the receiver(s) 125 include a chirp generator 130.

The example controller 110 of the illustrated example of FIG. 1 generates a digital input to the chirp generator 130. The example controller 110 provides control signals to the chirp generator(s) 130 of the corresponding transmitter(s) 120 or receiver(s) 125. The control signals enable coding to be overlaid onto the generated chirps thereby enabling differentiation of chirps emitted by different transmitters (and/or transmitters of remote radar systems, such as a nearby vehicle) The example controller 110 is implemented by a logic circuit such as, for example, a hardware processor. However, any other type of circuitry may additionally or alternatively be used such as, for example, one or more analog or digital circuit(s), logic circuits, programmable processor(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)), etc.

The example local oscillator 115 of the illustrated example of FIG. 1 provides a fixed reference frequency (LOref) to the chirp generator 130 of each of the transmitter(s) 120 and/or receiver(s) 125. The example local oscillator 115 is implemented using a crystal oscillator. However, any other approach to creating a fixed reference frequency signal may additionally or alternatively be used such as, for example, a voltage-controlled oscillator (VCO), a function generator, etc.

The transmitter 120 of the illustrated example of FIG. 1 generates a chirp signal. In examples disclosed herein, the transmitter outputs the generated chirp to the antenna 150. In the illustrated example of FIG. 1, each transmitter 120 outputs their respective chirp to a same antenna 150. However, in some examples, multiple different antenna(s) 150 may be used in connection with the transmitters(s) 120. In some examples, the transmitter(s) 120 include a radio frequency (RF) amplifier to increase the power of the chirp signals. In some examples, the transmitter(s) include an impedance matching circuit to match the impedance of the transmitter(s) 120 to the antenna 150. The chirp signals from the transmitters 120 are then sent to the antenna 150 where they are emitted. In the illustrated example of FIG. 1, three transmitters 120 are shown. However, any number of transmitters 120 may additionally or alternatively be used. For example, a MIMO radar system 100 depicted in FIG. 1 may contain, for example, one hundred transmitter circuits. Utilizing additional transmitter(s) 120 enables additional chirp signals to be generated simultaneously.

The receiver(s) 125 of the illustrated example of FIG. 1 analyzes chirp signal(s) returned via the antenna 150. In examples disclosed herein, the chirp signals are analyzed to identify information from the chirp signals including, for example a distance, angle, and/or velocity of an object. In some examples, the example receiver(s) 125 are implemented with an electronic amplifier circuit to strengthen the received chirp signal as well as a chirp processing unit 135 to determine useful information from the received chirp signal. In this example FIG. 1 includes the structures for multiple receivers. For example, a MIMO radar system 100 depicted in FIG. 1 may contain, for example, ten receiver circuits, however any number of receiver circuits can be implemented in the example radar system 100.

The example antenna 150 of the illustrated example of FIG. 1 emits electromagnetic waves (e.g., radio waves) from the antenna terminals during transmission. The example antenna 150 also intercepts the power of radio waves and produces a signal at a terminal of the antenna to supply the signal to the receiver 125. The example antenna 150 of FIG. 1 is implemented using an array of conductors connected to the transmitter(s) 120 and receiver(s) 125. However, any other arrangement and/or type of conductor material may be used such as, for example, copper, aluminum, silver, etc.

The example chirp generator 130 of FIG. 1 generates a chirp based on the local oscillator input and the control input (e.g., a digital input) received from the controller. In the context of the transmitter(s) 120, the chirp is output to the antenna 150. In the context of the receiver(s) 125, the chirp is output to the chirp processing unit 135 where it is used as a reference signal that can be compared against chirps received via the antenna 150. An example approach for implementing the example chirp generator 130 is disclosed in connection with FIG. 2.

The chirp processing unit 135 receives the chirp output of the chirp generator 130 in the example receiver(s) 125. The chirp processing unit 135 uses the chirp output from the chirp generator 130 in the receiver(s) 125 as a reference signal. The chirp output is referenced when comparing received chirp signals via the antenna 150 to the chirp output signal. This comparison allows for matching transmission chirp signals to chirp signals received in order to extract information from the chirp signal (e.g., a distance from the antenna, a velocity of the object, etc.). The example chirp processing unit 135 is implemented using a logic circuit such as, for example, a hardware processor. However, any other type of circuitry may additionally or alternatively be used such as, for example, one or more analog or digital circuit(s), logic circuits, programmable processor(s), ASIC(s), DSP(s), FPGA(s), GPU(s), PLD(s), FPLD(s), etc.

Figure 2:
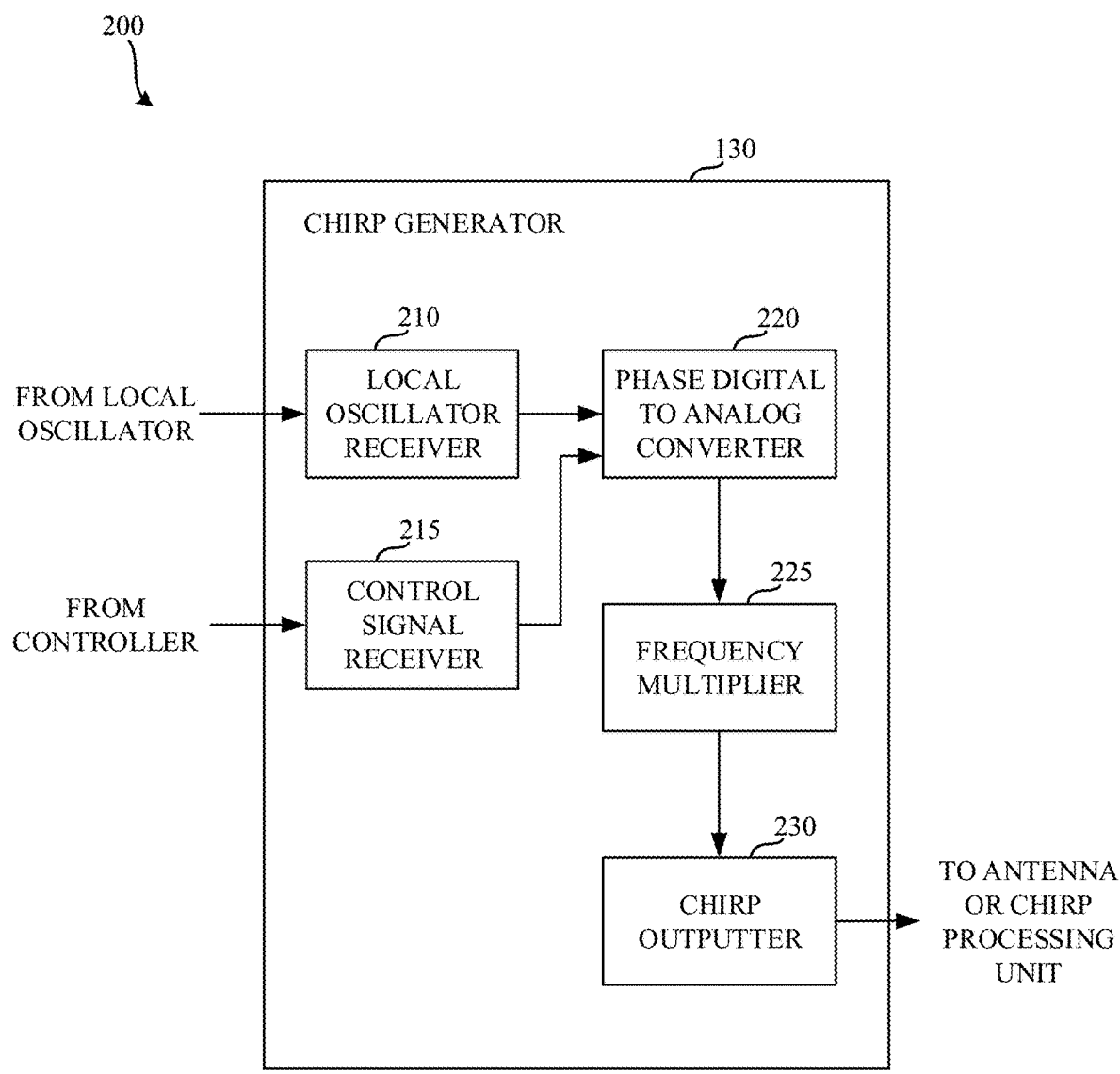
FIG. 2 is a block diagram representative of a chirp generator in the example MIMO radar system of FIG. 1.

FIG. 2 is a block diagram illustrating an example implementation of the chirp generator 130 of FIG. 1. The example chirp generator 130 of FIG. 2 includes a local oscillator receiver 210, a control signal receiver 215, a phase digital-to-analog converter (DAC) 220, a frequency multiplier 225, and a chirp outputter 230.

The example local oscillator receiver 210 of the illustrated example FIG. 2 receives a fixed frequency reference (LOref) from the local oscillator 115 of FIG. 1. The fixed frequency reference (LOref) received via the local oscillator 115 is divided by an arbitrary value of N, which results in a reference clock derived from the frequency reference. The example local oscillator receiver outputs the reference clock to the phase DAC 220. In some examples, the local oscillator receiver 210 implements means for generating.

The example control signal receiver 215 receives a digital input from the controller 110 of FIG. 1. In examples disclosed herein, the digital input from the controller 110 includes sixteen bits, and allows for additional coding to be included in the generated chirps. However, any other number of inputs may additionally or alternatively be received. This additional coding specifies phase or frequency modulation desired for the chirp signal from fixed frequency reference (LOref). Such phase and/or frequency modulation may be used to, for example, distinguish chirps emitted by the transmitters from transmitters of other radar systems and/or other transmitters within the radar system 100. In examples disclosed herein, the example control signal receiver 215 includes digital input pins to receive the digital inputs in parallel (e.g., a one-to-one mapping of pins to bits of the control signal). However, in some examples, the control signal receiver 215 may be implemented in any other manner such as, for example, via a single pin using a serial communication protocol (e.g., inter-integrated circuit (I2C), Recommended Standard 232 (RS232), etc.).

The example phase DAC 220 of the illustrated example of FIG. 2 receives the clock generated from the frequency reference (LOref) via the local oscillator receiver 210, and the digital input via the control signal receiver 215. The phase DAC 220 is clocked synchronous to the clock received from the local oscillator receiver 210. As used herein, clocked synchronous refers to the clock of the phase DAC 220 and the clock of the local oscillator receiver 210 being synchronized to each other. The digital input received from the control signal receiver 215 is used by the phase DAC 220 to determine if a phase or frequency modulation is necessary. The example phase DAC 220 outputs a phase modulated input centered on an intermediate frequency (DIF using the digital input and the reference clock. Example approaches for implementing the phase DAC 220 are disclosed in further detail in connection with FIGS. 3, 4, 5, and/or 6. In some examples, the phase DAC 220 implements means for converting.

The example frequency multiplier 225 receives the phase modulated input centered on an intermediate frequency from the example phase DAC 220 and frequency multiplies that input by a factor of M, where M is a natural number. The example frequency multiplier 225 is implemented using a nonlinear circuit such as, for example, a diode. However, any other type of circuitry may additionally or alternatively be used such as, for example, amplifiers or multipliers. In some examples, the frequency multiplier 225 implements means for frequency multiplying.

The example chirp outputter 230 of the example of FIG. 2 receives a frequency multiplied phase modulated input from the example frequency multiplier 225, and outputs the chirp. In some examples, the chirp outputter 230 may include signal modifying circuitry to, for example, filter noise (e.g., low frequency noise) introduced by the frequency multiplier 225, to amplify the chirp, etc. When, for example, the chirp generator 130 is implemented as part of a transmitter, the chirp outputter 230 outputs the chirp signal to the antenna 150 of FIG. 1. Conversely, when the chirp generator is implemented as part of a receiver, the chirp generator 230 outputs the generated chirp to the chirp processing unit 135 of FIG. 1.

Figure 3:
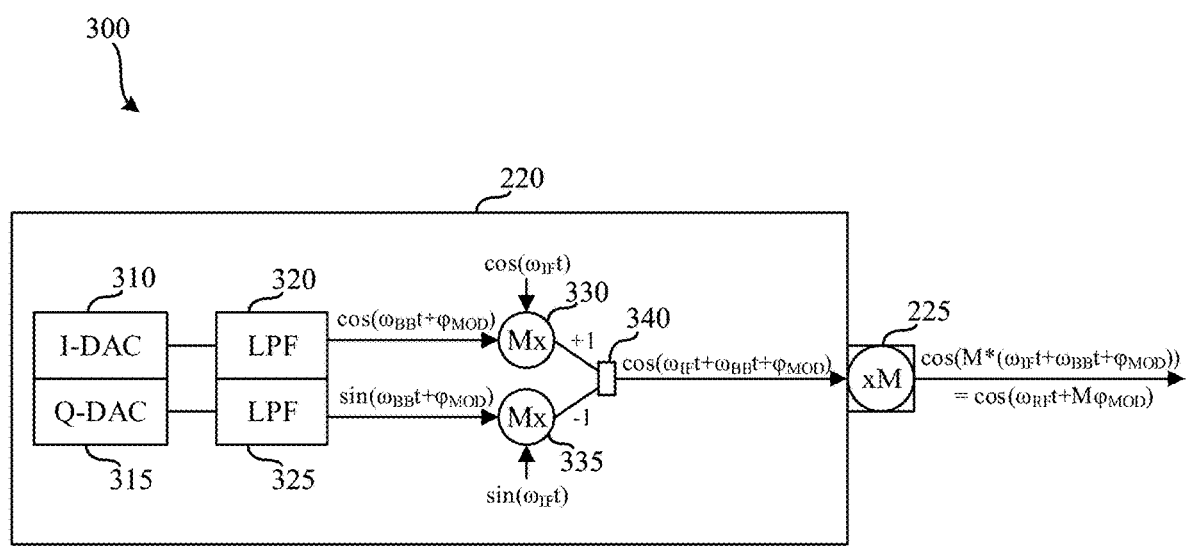
FIG. 3 is a block diagram of an example implementation of the phase digital-to-analog converter (DAC) using I/Q DACs in voltage/current mode for a single phase output.
Figure 4:
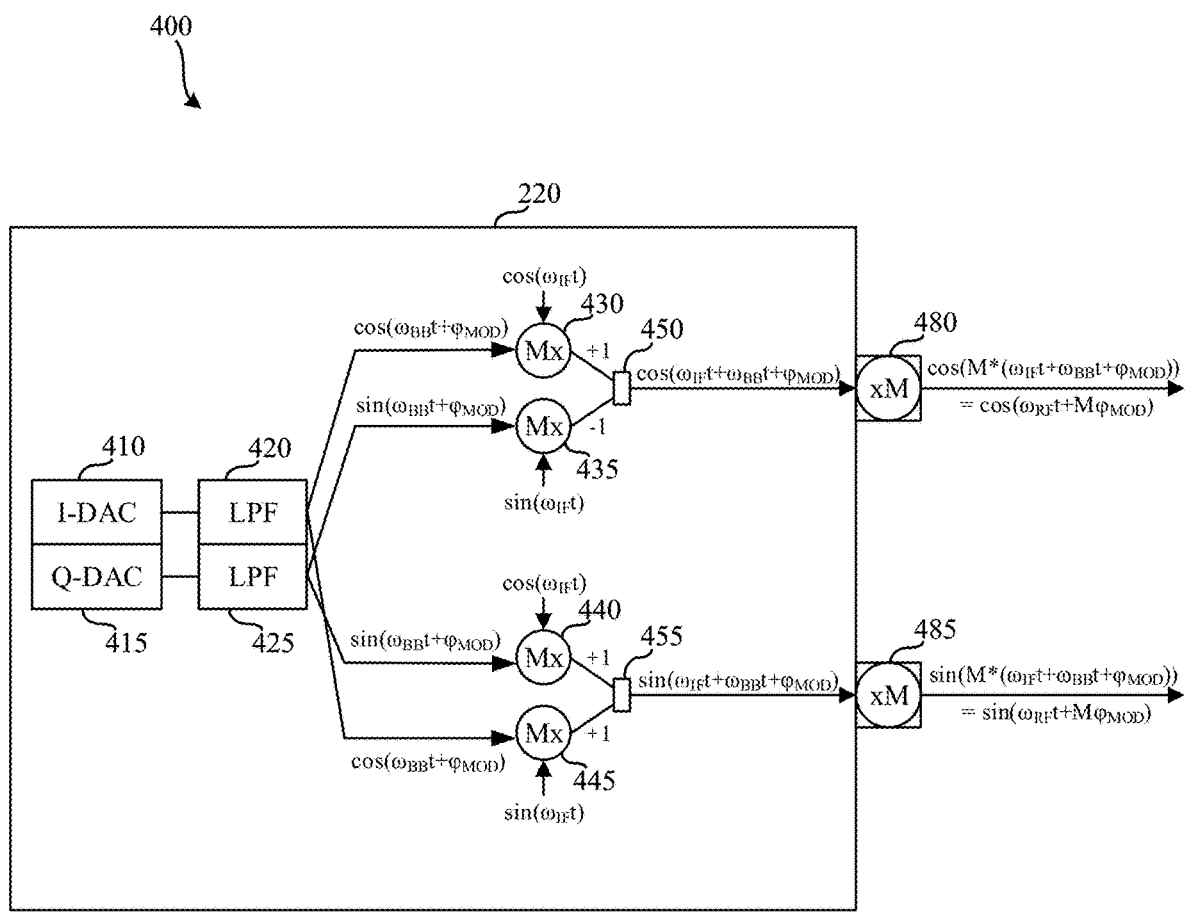
FIG. 4 is a block diagram of an example implementation of the phase DAC using I/Q DACs in voltage/current mode for a quadrature output.
Figure 5:
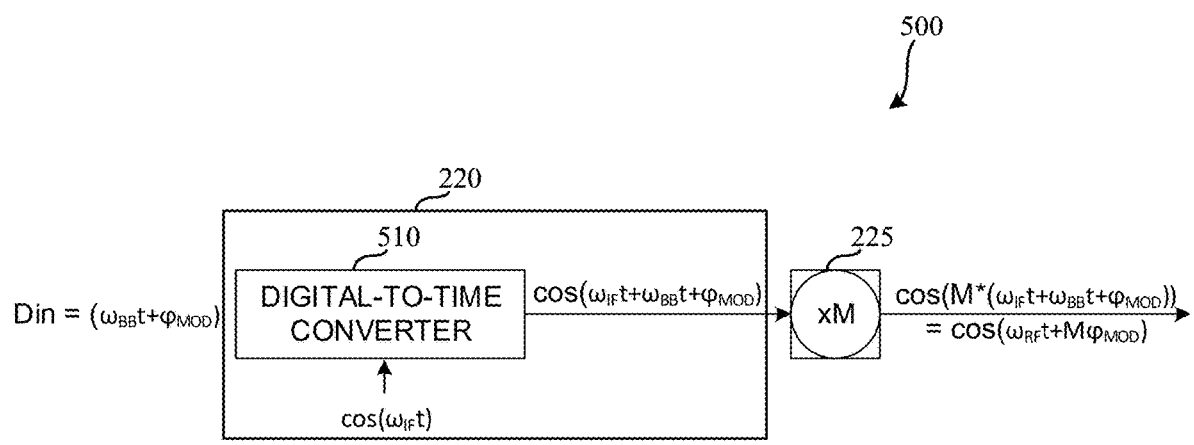
FIG. 5 is a block diagram of an example implementation of the phase DAC using a digital-to-time converter for a single phase output.

FIGS. 3, 4, 5, and/or 6 illustrate example implementations of the phase DAC 220 and the frequency multiplier 225 of the example FIG. 2. In each of the examples depicted in FIGS. 3, 4, 5, and 6, the phase DAC 220 is prior to the frequency multiplier 225, which provides for a bandwidth expansion. That is, the placement of the phase DAC 220 prior to the frequency multiplier 225 has the advantage of expanding the bandwidth of the phase DAC 220 ($BW_{PDAC}$)

output by the multiplication factor M to achieve a wider RF bandwidth ($BW_{RF}$). The fact that radar systems primarily rely on phase modulation schemes enables this concept since the output of the phase DAC 220 is a constant amplitude signal with only phase and/or frequency modulation which will be amplified by the frequency multiplier providing the desired bandwidth expansion. As a result, the data rate of the digital input and bandwidth/clocking requirements ($ck_{ref}$) of the phase DAC 220 are reduced by the factor M to meet a wider desired RF bandwidth as described in Equations 1 and 2 below.

$$BW_{PDAC} = \frac{BW_{RF}}{M} \quad \text{Equation 1}$$

As noted above, in Equation 1, $BW_{PDAC}$ represents the bandwidth of the phase DAC 220, $BW_{RF}$ represents the RF bandwidth, and M represents the multiplication factor.

$$ck_{ref} \geq 2 * \frac{BW_{RF}}{M} = 2 * BW_{PDAC} \quad \text{Equation 2}$$

In Equation 2, above, $ck_{ref}$ represents bandwidth/clocking requirements of the phase DAC 220.

In the examples of FIGS. 3, 4, 5, and/or 6, the example frequency multiplier 225 uses a multiplying factor M. In examples disclosed herein, the multiplying factor M is a value in the range of one to eight (inclusive). In some examples, a multiplication factor outside of the range of one to eight may additionally or alternatively be used. In examples disclosed herein, the phase DAC 220 operates using a fixed input reference frequency (LOref) and a digital input representing a frequency shift from LOref and/or a phase shift from LOref. In examples disclosed herein, the phase modulation for the output FMCW signals is represented by $\phi_{MOD}$. In the illustrated examples of FIGS. 3, 4, 5, and/or 6, the final output of the phase DAC 220 is generated through either the summation (+1) or difference (−1) of the mixer outputs, as seen in the example FIGS. 3 and/or 4. Such example implementations of the phase DAC 220 of FIGS. 3, 4, 5, and/or 6 enable the proposed chirp generator 130 to operate with MIMO Tx/Rx by providing independent modulation for each Tx/Rx. As a result, the examples of FIGS. 3, 4, 5, and 6 enable phase and/or frequency modulation within the chirp generator 130 of the example MIMO radar system 100 in FIG. 1.

FIG. 3 depicts an example implementation 300 of the phase DAC 220 and the frequency multiplier 225 of the example FIG. 2. This example implementation 300 of the phase DAC 220 includes an I-DAC 310, a Q-DAC 315, a first low pass filter (LPF) 320, a second LPF 325, a first mixer 330, a second mixer 335, and a summation circuit 340.

The example I-DAC 310 of the illustrated example of FIG. 3 is a DAC operating in current mode. The example I-DAC 310 extracts the current data from a digital quadrature (90 degrees out of phase) input signal from the control signal receiver 215. The I-DAC 310 converts the input signal into an analog output signal. The I-DAC 310 is implemented using a logic circuit such as, for example, an operational amplifier and switches. However, any other type of circuitry may additionally or alternatively be used. In some examples, the I-DAC 310 implements means for converting.

The example Q-DAC 315 of the illustrated example of FIG. 3 is implemented using a DAC operating in voltage mode. The example Q-DAC 315 extracts the voltage data from a digital quadrature (90 degrees out of phase) input signal from the control signal receiver 215. The Q-DAC 315 converts the input signal into an analog output signal. The Q-DAC 315 is implemented using a logic circuit such as, for example, an operational amplifier and switches. However, any other type of logic circuitry may additionally or alternatively be used. In some examples, the Q-DAC 315 implements means for converting.

The example first LPF 320 receives the analog current output from the I-DAC 310 and applies a low pass filter to generate a phase modulated cosinusoidal signal ($\cos(\omega_{BB}t+\phi_{MOD})$) centered on DC value or a low intermediate frequency ($\omega_{BB}+\phi_{MOD}$) from a quadrature input. For the low intermediate frequency, $\omega_{BB}$ is the baseband frequency and $\phi_{MOD}$ is the desired phase modulation. The example first LPF 320 is implemented using an analog circuit including, for example, a resistor and a capacitor (e.g., an RC filter). However, any other type of circuitry may additionally or alternatively be used. In some examples, the LPF 320 implements means for generating.

The example second LPF 325 receives the analog voltage output from the Q-DAC 315 and applies a low pass filter to generate a phase modulated sinusoidal signal centered on DC or a low intermediate frequency $\sin(\omega_{BB}t+\phi_{MOD})$ from a quadrature input. The example second LPF 325 is implemented using an analog circuit including, for example, a resistor and a capacitor (e.g., an RC filter). However, any other type of circuitry may additionally or alternatively be used. In some examples, the LPF 325 implements means for generating.

The example first mixer 330 of the example FIG. 3 receives the centered phase modulated cosinusoidal signal from the LPF 320, and up-converts the input centered cosinusoidal signal to the input LOref from the local oscillator receiver 210 using quadrature mixing. The quadrature mixing provides a rejection of the undesired image at $\omega_{IF}-\omega_{BB}-\phi_{MOD}$, where CO is an intermediate frequency, $\omega_{BB}$ is the baseband frequency, and $\phi_{MOD}$ is the desired phase modulation. The example first mixer 330 outputs the resulting quadrature mixed cosinusoidal signal. The first mixer 330 is implemented using a non-linear circuit such as, for example, a diode, a switch, etc. However, any other type of circuitry may additionally or alternatively be used. In some examples, the first mixer 330 implements means for up-converting.

The example second mixer 335 of the example FIG. 3 receive the centered phase modulated sinusoidal signal from the LPF 325, and up-converts the input centered sinusoidal signal to the input LOref from the local oscillator receiver 210 using quadrature mixing. The quadrature mixing provides a rejection of the undesired image at $\omega_{IF}-\omega_{BB}-\phi_{MOD}$. The example second mixer 335 outputs the resulting quadrature mixed sinusoidal signal. The second mixer 335 is implemented using a non-linear circuit such as, for example, a diode, a switch, etc. However, any other type of circuitry may additionally or alternatively be used. In some examples, the second mixer 335 implements means for up-converting.

The summation circuit 340 combines the output of the first mixer 330 and the second mixer 335. In the illustrated example of FIG. 3, the summation circuit 340 subtracts the output of the second mixer 335 from the output of the first mixer 330. However, any other approach to summation of the mixer outputs may additionally or alternatively be used. The result of the summation circuit 340 of FIG. 3 create an output of $\cos(\omega_{IF}t+\omega_{BB}t+\phi_{MOD})$ from the phase DAC 220 in example FIG. 3. The $\omega_{IF}t$ of the output signal represents the frequency of the signal at the output of the local oscillator receiver 210 of the example of FIG. 2, the $\omega_{BB}t$ of the output signal represents the desired frequency shift at the output of the phase DAC 220 (if such a frequency shift is required), and the $\phi_{MOD}$ of the output signal represents the desired phase modulation at the output of the phase DAC 220 (if such phase modulation is required). In some examples, the summation circuit 340 implements means for combining.

The example frequency multiplier 225 of the example FIG. 2 receives the output $\cos(\omega_{IF}t+\omega_{BB}t+\phi_{MOD})$ of the phase DAC 220 and frequency multiplies the output of the phase DAC by a factor of M. The frequency multiplier 225 outputs the example desired RF signal: $\cos(M^*(\omega_{IF}t+\omega_{BB}t+\phi_{MOD})=\cos(\omega_{RF}t+M^*\phi_{MOD}))$. In the example output RF signal, M represents the frequency multiplying factor, $\omega_{IF}t$ represents the frequency of the signal at the output of the local oscillator receiver 210 of the example of FIG. 2, $\omega_{BB}t$ represents the desired frequency shift at the output of the phase DAC 220, $\phi_{MOD}$ represents the desired phase modulation, and $\omega_{RF}t$ represents the output frequency at the output of the frequency multiplier 225 such that $\omega_{RF}t=M^*(\omega_{BB}t+\omega_{IF}t)$. The frequency multiplier 225 is implemented using a nonlinear circuit such as, for example, a diode. However, any other type of circuitry may additionally or alternatively be used such as, for example, amplifiers or multipliers. In some examples, the frequency multiplier 225 implements means for frequency multiplying.

FIG. 4 depicts an example implementation 400 of the phase DAC 220 and the frequency multiplier 225 of the example FIG. 2. This example implementation 400 of the phase DAC 220 provides quadrature output from the phase DAC 220, which is particularly useful for Rx I/Q mixers that utilize quadrature LORF signals to operate. The example implementation 400 of FIG. 4 includes an I-DAC 410, a Q-DAC 415, a first LPF 420, a second LPF 425, a first mixer 430, a second mixer 435, a third mixer 440, a fourth mixer 445, a first summation circuit 450, a second summation circuit 455, a first frequency multiplier 480, and a second frequency multiplier 485.

The example I-DAC 410 of the illustrated example of FIG. 4 is a DAC operating in current mode. The I-DAC 410 extracts the current data from a digital quadrature (90 degrees out of phase) input signal from the control signal receiver 215. The I-DAC 410 converts the input signal into an analog output signal. The example I-DAC 410 takes in the sixteen bit input signal from the control signal receiver 215 and converts it into an analog current signal output. The I-DAC 410 is implemented using a logic circuit such as, for example, an operational amplifier and switches. However, any other type of circuitry may additionally or alternatively be used. In some examples, the I-DAC 410 implements means for converting.

The example Q-DAC 415 of the illustrated example of FIG. 4 is a DAC operating in voltage mode. The Q-DAC 415 extracts the voltage data from a digital quadrature (90 degrees out of phase) input signal from the control signal receiver 215. The Q-DAC 415 converts the input signal into an analog output signal. The example Q-DAC 415 takes in the sixteen bit input signal from the control signal receiver and converts it into an analog voltage signal output. The Q-DAC 415 is implemented using a logic circuit such as, for example, an operational amplifier and switches. However, any other type of circuitry may additionally or alternatively be used. In some examples, the Q-DAC 415 implements means for converting.

The example first LPF 420 receives the analog current output from the I-DAC 410 and applies a low pass filter to generate aphase modulated cosinusoidal signal ($\cos(\omega_{BB}t+\phi_{MOD})$) centered on DC or a low intermediate frequency ($\omega BB+\phi_{MOD}$) from a quadrature input. For the low intermediate frequency, COBB is the baseband frequency and $\phi_{MOD}$ is the desired phase modulation. The example first LPF 420 is implemented using an analog circuit including, for example, a resistor and a capacitor (e.g., an RC filter). However, any other type of circuitry may additionally or alternatively be used. In some examples, the LPF 420 implements means for generating.

The example second LPF 425 receives the analog voltage output from the Q-DAC 415 and applies a low pass filter to generate two phase modulated sinusoidal signals ($\sin(\omega_{BB}t+\phi_{MOD})$) centered on DC or a low intermediate frequency from a quadrature input. The example second LPF 425 is implemented using an analog circuit such as, for example, a resistor and a capacitor (e.g., an RC filter). However, any other type of circuitry may additionally or alternatively be used. In some examples, the LPF 425 implements means for generating.

The example first mixer 430 of the example FIG. 4 receives the centered phase modulated cosinusoidal signal from the first LPF 420 and up-converts the input centered cosinusoidal signal to the input LOref signal from the local oscillator receiver 210 using quadrature mixing. The quadrature mixing provides a rejection of the undesired image at $\omega_{IF}-\omega_{BB}-\phi_{MOD}$, where $\omega_{IF}$ is an intermediate frequency, $\omega BB$ is the baseband frequency, and $\phi_{MOD}$ is the desired phase modulation. The example first mixer 430 outputs the resulting quadrature mixed cosinusoidal signal. The first mixer 430 is implemented using a non-linear circuit such as, for example, a diode, a switch, etc. However, any other type of circuitry may additionally or alternatively be used. In some examples, the first mixer 430 implements means for up-converting.

The example second mixer 435 of the example FIG. 4 receives the centered phase modulated sinusoidal signal from the second LPF 425 and up-converts the input centered sinusoidal signal to the input LOref signal from the local oscillator receiver 210 using quadrature mixing. The quadrature mixing provides a rejection of the undesired image at $\omega_{IF}-\omega_{BB}-\phi_{MOD}$. The example second mixer 435 outputs the resulting quadrature mixed sinusoidal signal. The second mixer 435 is implemented using a non-liner circuit such as, for example, a diode, a switch, etc. However, any other type of circuitry may additionally or alternatively be used. In some examples, the second mixer 435 implements means for up-converting.

The first summation circuit 450 combines the output of the first mixer 430 and the second mixer 435. In the illustrated example of FIG. 4, the first summation circuit 450 subtracts the output of the second mixer 435 from the output of the first mixer 330. However, any other approach to summation of the mixer outputs may additionally or alternatively be used. The results of the first summation circuit 450 of FIG. 4 creates an output of $\cos((\omega_{IF}t+\omega_{BB}t+\phi_{MOD})$ from the phase DAC 220 in example FIG. 4. The $\omega_{IF}t$ of the output signal represents the frequency of the signal at the output of the local oscillator receiver 210 of the example of FIG. 2, the $\omega_{BB}t$ of the output signal represents the desired frequency shift at the output of the phase DAC 220, and the $\phi_{MOD}$ of the output signal represents the desired phase modulation. In some examples, the first summation circuit 450 implements means for combining.

The example third mixer 440 of the example FIG. 4 receives the centered phase modulated sinusoidal signal from the second LPF 425 and up-converts the input centered sinusoidal signal to the input LOref signal from the local oscillator receiver 210 using quadrature mixing. The quadrature mixing provides a rejection of the undesired image at $\omega_{IF}$-$\omega_{BB}$-$\phi_{MOD}$. The example third mixer 440 outputs the resulting quadrature mixed sinusoidal signal. The third mixer 440 is implemented using a non-linear circuit such as, for example, a diode, a switch, etc. However, any other type of circuitry may additionally or alternatively be used. In some examples, the third mixer 440 implements means for up-converting.

The example fourth mixer 445 of the example FIG. 4 receives the centered phase modulated cosinusoidal signal from the first LPF 420 and up-converts the input centered cosinusoidal signal to the input LOref signal from the local oscillator receiver 210 using quadrature mixing. The quadrature mixing provides a rejection of the undesired image at $\omega_{IF}$-$\omega_{BB}$-$\phi_{MOD}$. The example fourth mixer 445 outputs the resulting quadrature mixed cosinusoidal signal. The fourth mixer 445 is implemented using a non-liner circuit such as, for example, a diode, a switch, etc. However, any other type of circuitry may additionally or alternatively be used. In some examples, the fourth mixer 445 implements means for up-converting.

The second summation circuit 455 combines the output of the third mixer 440 and the fourth mixer 445. In the illustrated example of FIG. 4, the second summation circuit 450 adds the output of the fourth mixer 445 to the ouput of the third mixer 440. However, any other approach to summation of the mixer outputs may additionally or alternatively be used. The results of the second summation circuit 450 of FIG. 4 creates an output of $\sin(\omega_{IF}t+\omega_{BB}t+\phi_{MOD})$ from the phase DAC 220 in example FIG. 4. The $\omega_{IF}t$ of the output signal represents the frequency of the signal at the output of the local oscillator receiver 210 of the example of FIG. 2, the $\omega_{BB}t$ of the output signal represents the desired frequency shift at the output of the phase DAC 220, and the $\phi_{MOD}$ of the output signal represents the desired phase modulation. In some examples, the second summation circuit 455 implements means for combining.

The example first frequency multiplier 480 of the example FIG. 4 receives the output $\cos(\omega_{IF}t-\omega_{BB}t-\phi_{MOD})$ of the phase DAC 220 and frequency multiplies by a factor M. The first frequency multiplier 480 outputs the example desired quadrature RF signal: $\cos(M*(\omega_{IF}t+\omega_{BB}t+\phi_{MOD})=\cos(\omega_{RF}t+M*\phi_{MOD}))$. In the example output quadrature RF signal, the M represents the frequency multiplying factor, $\omega_{IF}t$ represents the frequency of the signal at the output of the local oscillator receiver 210 of the example of FIG. 2, $\omega_{BB}t$ represents the desired frequency shift at the output of the phase DAC 220, $\phi_{MOD}$ represents the desired phase modulation, and $\omega_{RF}t$ represents the output frequency at the output of the frequency multiplier 225 such that $\omega_{RF}t=M*(\omega_{BB}t+\omega_{IF}t)$. The first frequency multiplier 480 is implemented using a nonlinear electronic circuit such as, for example, a diode. However, any other type of circuitry may additionally or alternatively be used such as, for example, amplifiers or multipliers. In some examples, the first frequency multiplier 480 implements means for frequency multiplying.

The example second frequency multiplier 485 of the example FIG. 4 receives the output $\sin(\omega_{IF}t-\omega_{BB}t-\phi_{MOD})$ of the phase DAC 220 and frequency multiplies by a factor M. The second frequency multiplier 485 outputs the example desired quadrature RF signal: $\sin(M*(\omega_{IF}+\omega_{BB}t+\phi_{MOD})=\sin(\omega_{RF}t+M*\phi_{MOD}))$. The second frequency multiplier 485 is implemented using a nonlinear electronic circuit such as, for example, a diode. However, any other type of circuitry may additionally or alternatively be used such as, for example, amplifiers or multipliers. In some examples, the second frequency multiplier 485 implements means for frequency multiplying.

FIG. 5 is a block diagram representing an example implementation 500 of the phase DAC 220 and the frequency multiplier 225 of the example FIG. 2. This example implementation 500 of the phase DAC 220 includes a digital-to-time converter 510. In some examples, the phase DAC 220 implements means for generating.

The example digital-to-time converter 510 receives the desired phase modulation ($\omega_{BB}t+\phi_{MOD}$) as a digital input from the control signal receiver 215. This example implementation of the phase DAC 220 allows the digital-to-time converter 510 to directly provide the output desired phase modulated signal of $\cos(\omega_{IF}t+\omega_{BB}t+\phi_{MOD})$ to the frequency multiplier 225. The digital-to-time converter 510 receives the output of the local oscillator receiver 210 of the example of FIG. 2 at a frequency $\omega_{IF}$. The digital-to-time converter 510 applies a time shift to the input signal dependent on the digital input received from the control signal receiver 215. This time shift applied by the digital-to-time converter 510 is translated to a phase shift to output the desired phase modulated signal to the frequency multiplier 225. The digital-to-time converter 510 is implemented using a logic circuit such as, for example, a FPGA. However, any other type of circuitry may additionally or alternatively be used such as, for example, one or more analog or digital circuit(s), logic circuits, programmable processor(s), GPU(s), DSP(s), ASIC(s), PLD(s) and/or FPLD(s), etc.

The example frequency multiplier 225 in the example FIG. 5 receives the output $\cos(\omega_{IF}t+\omega_{BB}t+\phi_{MOD})$ of the digital-to-time converter 510 and frequency multiplies the output by a factor of M. The frequency multiplier 225 outputs the desired RF signal $\cos(M*(\omega_{IF}t+_{BB}t+\phi_{MOD})=\cos(\omega_{RF}t+M*\phi_{MOD}))$. In the example output RF signal, the M represents the frequency multiplying factor, $\omega_{IF}t$ represents the frequency of the signal at the output of the local oscillator receiver 210 of the example of FIG. 2, $\omega_{BB}t$ represents the desired frequency shift at the output of the phase DAC 220, $\phi_{MOD}$ represents the desired phase modulation, and $\omega_{RF}t$ represents the output frequency at the output of the frequency multiplier 225 such that $\omega_{RF}t=M*(\omega_{BB}t+\omega_{IF}t)$. The frequency multiplier 225 is implemented using a nonlinear electronic circuit such as, for example, a diode. However, any other type of circuitry may additionally or alternatively be used such as, for example, amplifiers or multipliers. In some examples, the frequency multiplier 225 implements means for frequency multiplying.

Figure 6:
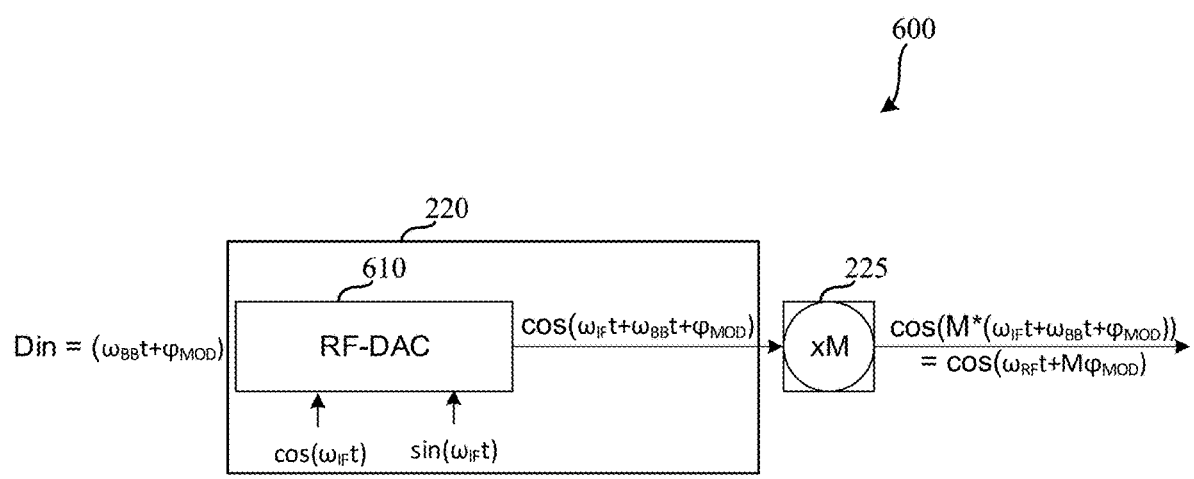
FIG. 6 is a block diagram of an example implementation of the phase DAC using a radio-frequency digital-to-analog converter (RF-DAC) for a single phase output.

FIG. 6 is a block diagram of an example implementation 600 of the phase DAC 220 and the frequency multiplier 225 of FIG. 2. The example implementation 600 of the phase DAC 220 includes a radio-frequency digital-to-analog converter (RF-DAC) 610 instead of using the I/Q DACs of the examples in FIGS. 3 and/or 4. In some examples, the phase DAC 220 implements means for generating.

A traditional DAC will accept a digital input and a clock, and output an analog signal that is represented by the digital input. The maximum frequency of the output analog signal of the traditional DAC that can be generated is less than equal to the clock frequency of the DAC. An RF-DAC, however, will shift that analog signal up to some higher frequency. In examples disclosed herein, the RF-DAC is clocked at wIF and it provides the desired analog signal at a frequency that is wIF+wBB. In contrast, a traditional DAC would provide the output signal at a frequency wBB. As used used herein, the term RF-DAC is used to indicate that the digital-to-analog conversion is performed and then upconverted (or mixed up) to some particular frequency (e.g., upcoverted to wIF).

The example RF-DAC 610 of the example FIG. 6 receives the desired phase modulation $\cos(\omega_{BB}t+\phi_{MOD}t)$ as the digital input from the control signal receiver 215. The example RF-DAC 610 outputs the desired phase modulated signal of $\cos(\omega_{IF}t+\omega_{BB}t+\phi_{MOD}t)$. In examples disclosed herein, the RF-DAC 610 is implemented using a logic circuit such as, for example, an operational amplifier and switches. However, any other type of circuitry my additionally or alternatively be used.

The example frequency multiplier 225 in the example FIG. 6 receives the output $\cos(\omega_{IF}t+\omega_{BB}t+\phi_{MOD})$ of the RF-DAC 610 and frequency multiplies the output by a factor of M. The frequency multiplier 225 outputs the example desired RF signal $\cos(M^*(\omega_{IF}t+\omega_{BB}t+\phi_{MOD})=\cos(\omega_{RF}t+M^*\phi_{MOD}))$. In the example output RF signal, the M represents the frequency multiplying factor, $w\omega_{IF}t$ represents the frequency of the signal at the output of the local oscillator receiver 210 of the example of FIG. 2, $\omega_{BB}t$ represents the desired frequency shift at the output of the phase DAC 220, $\phi_{MOD}$ represents the desired phase modulation, and $\omega_{RF}t$ represents the output frequency at the output of the frequency multiplier 225 such that $\omega_{RF}t=M^*(\omega_{BB}t+\omega_{IF}t)$. The frequency multiplier 225 is implemented using a nonlinear electronic circuit such as, for example, a diode. However, any other type of circuitry may additionally or alternatively be used such as, for example, amplifiers or multipliers. In some examples, the frequency multiplier 225 implements means for frequency multiplying.

While an example manner of implementing the chirp generator 130 of FIG. 1 is illustrated in FIGS. 2, 3, 4, 5, and/or 6, one or more of the elements, processes and/or devices illustrated in FIGS. 2, 3, 4, 5, and/or 6 may be combined, divided, re-arranged, omitted, eliminated and/or implemented in any other way. Further, the example local oscillator receiver 210, the example control signal receiver 215, the example phase digital to analog converter 220, the example frequency multiplier 225, the example chirp outputter 230 and/or, more generally, the example chirp generator 130 of FIG. 1 may be implemented by hardware, software, firmware and/or any combination of hardware, software and/or firmware. Thus, for example, any of the example local oscillator receiver 210, the example control signal receiver 215, the example phase digital to analog converter 220, the example frequency multiplier 225, the example chirp outputter 230 and/or, more generally, the example chirp generator 130 of FIG. 1 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example local oscillator receiver 210, the example control signal receiver 215, the example phase digital to analog converter 220, the example frequency multiplier 225, the example chirp outputter 230 and/or, more generally, the example chirp generator 130 of FIG. 1 is/are hereby expressly defined to include a non-transitory computer readable storage device or storage disk such as a memory, a digital versatile disk (DVD), a compact disk (CD), a Blu-ray disk, etc. including the software and/or firmware. Further still, the example chirp generator 130 of FIG. 1 may include one or more elements, processes and/or devices in addition to, or instead of, those illustrated in FIGS. 2, 3, 4, 5, and/or 6, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 9:
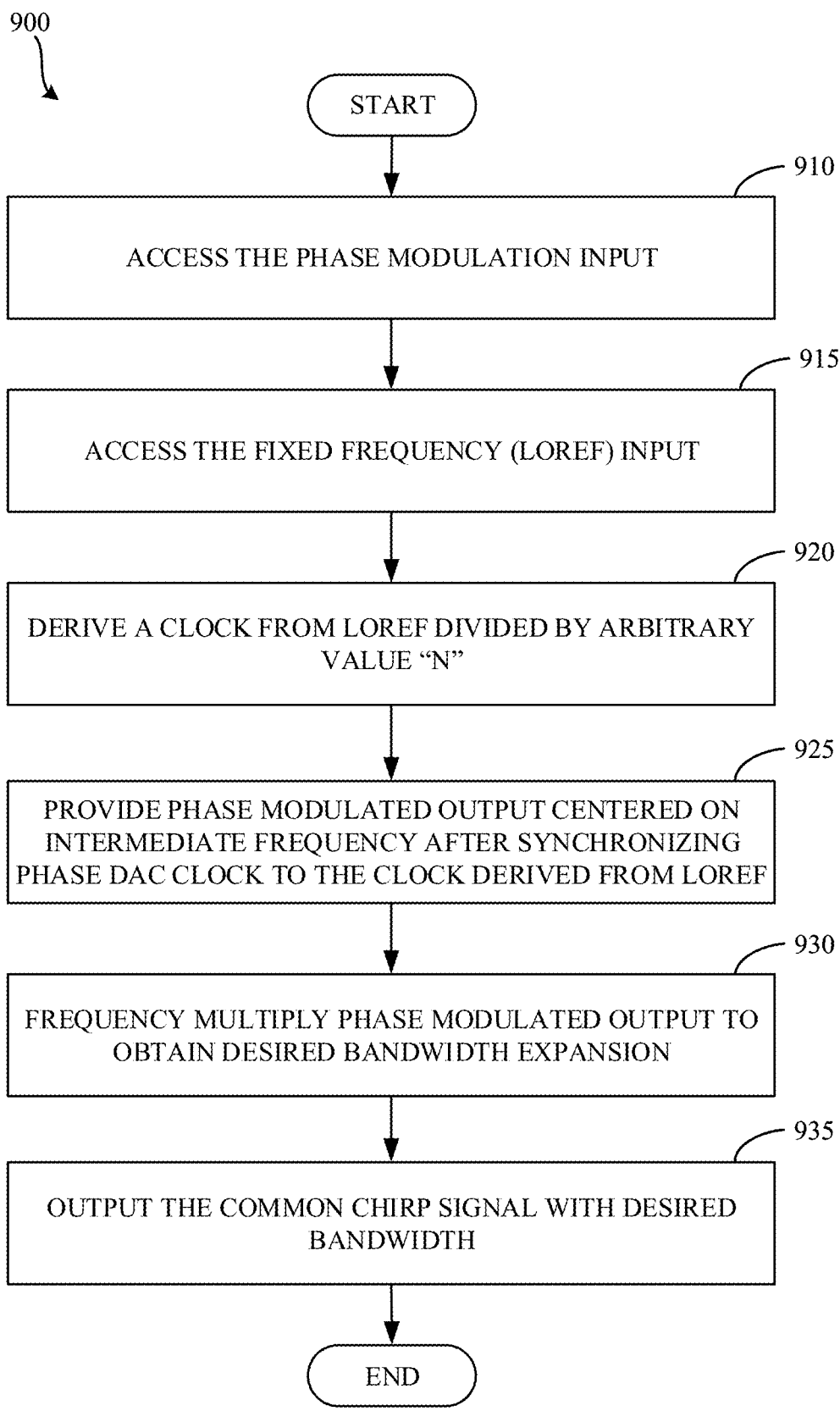
FIG. 9 is a flowchart representative of machine readable instructions which may be executed to implement the chirp generator of FIG. 2.

A flowchart representative of example hardware logic, machine readable instructions, hardware implemented state machines, and/or any combination thereof for implementing the chirp generator 130 of FIG. 1 is shown in FIG. 9. The machine readable instructions may be one or more executable programs or portion(s) of an executable program for execution by a computer processor such as the processor 912 shown in the example processor platform 900 discussed below in connection with FIG. 9. The program may be embodied in software stored on a non-transitory computer readable storage medium such as a CD-ROM, a floppy disk, a hard drive, a DVD, a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowchart illustrated in FIG. 9, many other methods of implementing the example chirp generator 130 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example process(es) of FIG. 9 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Figure 7:
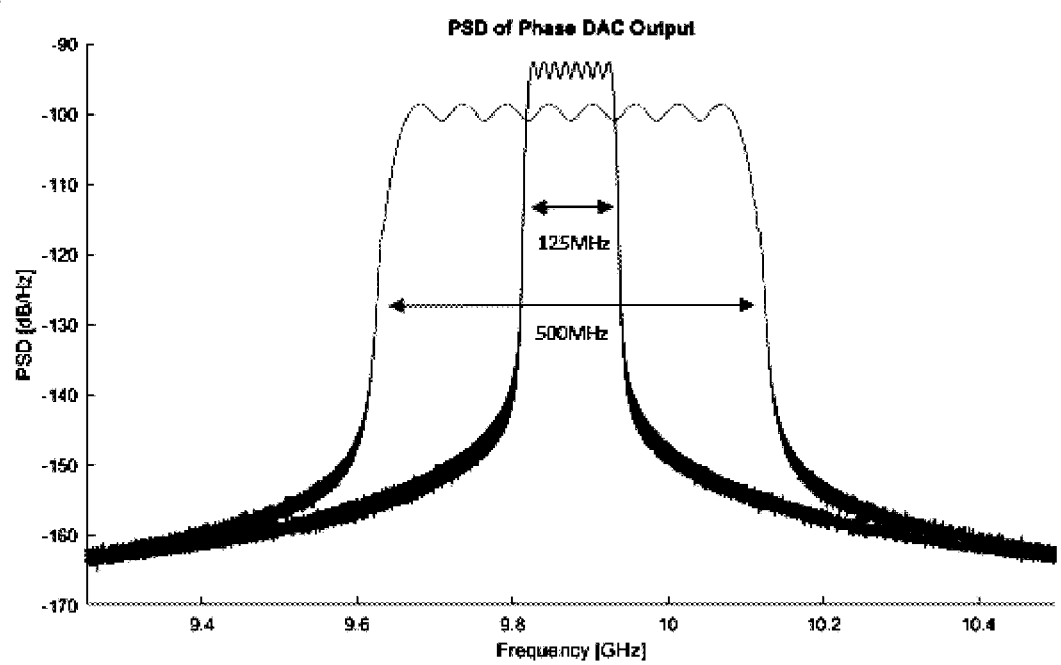
FIG. 7 includes graphs representing a simulation output spectrum of the proposed phase DAC before and after frequency multiplication.
Figure 7:
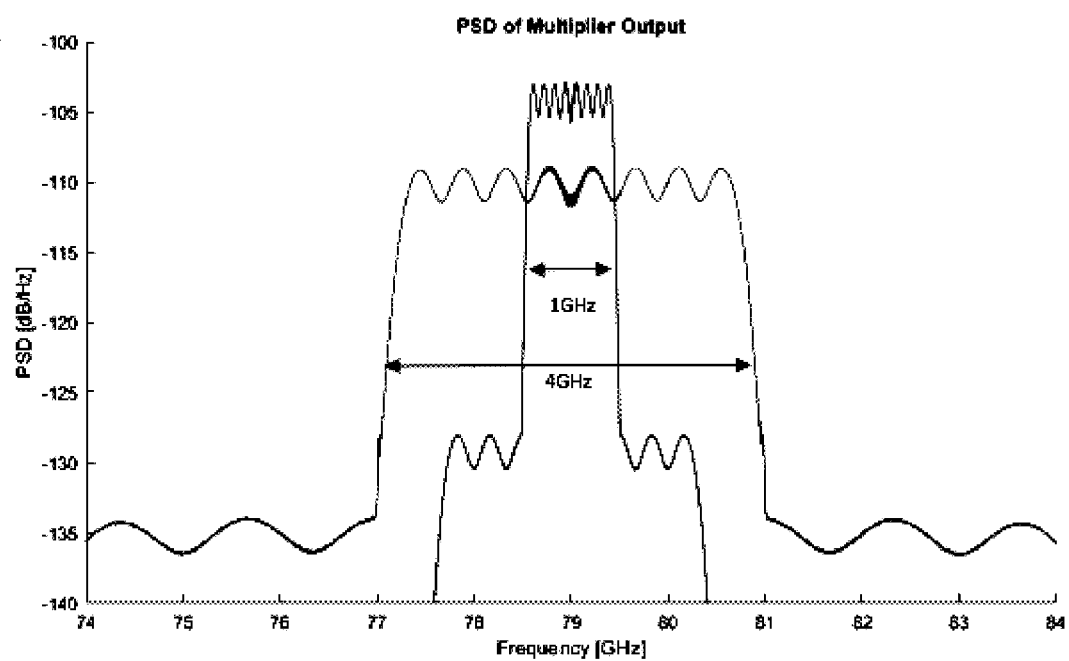

FIG. 7 depicts simulation results from the implementation of the phase DAC 220 seen in FIG. 3. The example graph 710 in FIG. 7 depicts the simulation results for the PSD (in dB/Hz) of the phase DAC 220 output over a range of frequencies in GHz. The example graph 720 in FIG. 7 depicts the simulation results for the PSD (in dB/Hz) of the frequency multiplier 225 output over a range of frequencies in GHz. These simulation results illustrate the bandwidth expansion to obtain FMCW signals with 1 GHz and 4 GHz bandwidths centered on 79 GHz and a chirp duration of 10 μs. As seen in the example graph 710 in FIG. 7, the phase DAC 220 generates a chirp centered on 9.875 GHz with bandwidths of only 125 MHz and 500 MHz for the two cases which are then expanded by an 8× frequency multiplication performed by the frequency multiplier 225 of FIG. 2.

Figure 8:
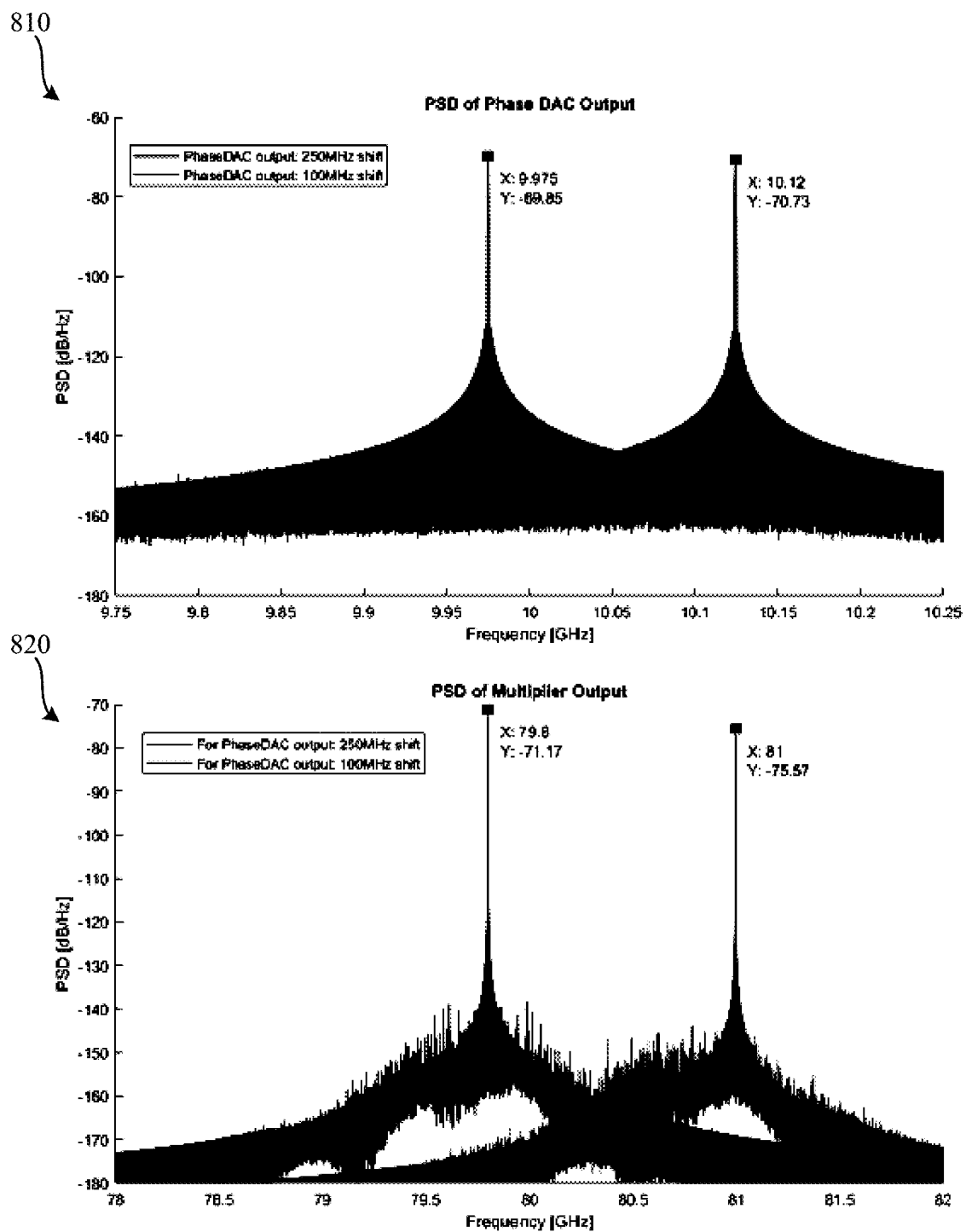
FIG. 8 includes graphs representing a simulation power spectral density (PSD) of the proposed phase DAC output and multiplied output.

FIG. 8 depicts simulation results that illustrate the phase DACs 220 ability to generate a desired frequency shift. The example graph 810 in FIG. 8 depicts the simulation results for the PSD (in dB/Hz) of the phase DAC 220 output over a range of frequencies in GHz. The example graph 820 in FIG. 8 depicts the simulation results for the PSD (in dB/Hz) of the frequency multiplier 225 output over a range of frequencies in GHz. In the illustrated example of FIG. 8, two cases are shown for frequency shifts from 79 GHz to 79.8 GHz and 81 GHz after frequency multiplication. Again, as seen in the example graph 810 in FIG. 8, the phase DAC 220 shifts the frequency by 100 MHz and 250 MHz in the two cases respectively and relies on the frequency multiplication (done by the frequency multiplier 225) to achieve the desired 800 MHz and 2 GHz shifts at RF. The frequency multiplication results can be seen in the example graph 820 in FIG. 8.

FIG. 9 is a flowchart illustrating a process 900 that is representative of machine-readable instructions which may be executed to implement the example chirp generator 130 architecture of FIG. 2. The program of FIG. 9 begins when the control signal receiver 215 reads the phase modulation input. (Block 910).

The example local oscillator receiver 210 in the chirp generator 130 accesses the fixed frequency (LOref) from the example local oscillator 115. (Block 915). The local oscillator receiver 210 derives a reference clock from the LOref input divided by a value "N." (Block 920). In the examples disclosed herein, the value "N" is chosen such that the value "N" is a positive value. Typically, the value "N" is an integer value of 1 or more. However, in some examples, the value of "N" can also be a non-integer value.

The example phase DAC 220 receives the digital input from the example control signal receiver 215 and the reference clock from the example local oscillator receiver 210. The phase DAC 220 provides the phase modulated output centered on an intermediate frequency after synchronizing the phase DAC 220 clock to the clock derived from LOref. (Block 925). In examples disclosed herein, the phase DAC 220 uses the required phase modulation read in as a digital input from the control signal receiver 215 to apply the phase modulation to the output signal. In examples disclosed herein, the reference clock from the local oscillator receiver 210 is used to synchronize the clock on the phase DAC 220 to center the signal on an intermediate frequency $\omega_{IF}$.

The example frequency multiplier 225 receives the phase modulated output centered on an intermediate frequency from the example phase DAC 220. The example frequency multiplier 225 frequency multiplies the phase modulated output to obtain a desired bandwidth expansion for a chirp signal. (Block 930). In the examples disclosed herein, the example frequency multiplier 225 uses a multiplication factor of M to frequency multiply the phase modulated output to obtain the desired bandwidth expansion.

The example chirp outputter 230 outputs the chirp signal with the desired bandwidth. (Block 935). In examples disclosed herein, if the chirp generator 130 is implemented in the transmitter(s) 120, the chirp signal is output to the antenna 150. In examples disclosed herein, if the chirp generator 130 is implemented in the receiver(s) 125, the chirp signal is output to the chirp processing unit 135 where it is used as a reference to compare with chirp signals received by the antenna 150.

Figure 10:
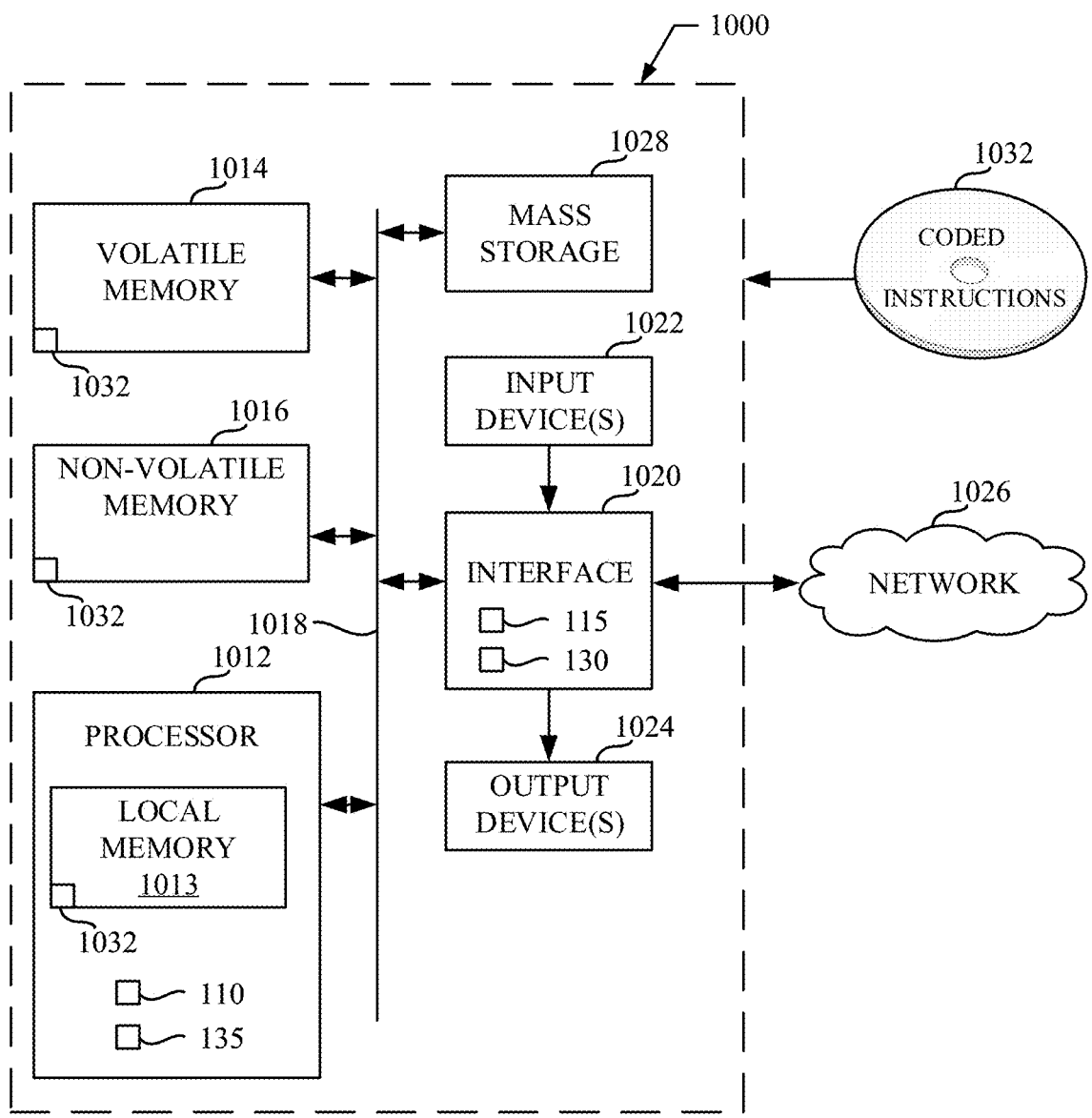
FIG. 10 is a block diagram of an example processing platform structured to execute the instructions of FIG. 9 to implement the chirp generator of FIG. 2.

FIG. 10 is a block diagram of an example processor platform 1000 structured to execute the instructions of FIG. 9 to implement the radar system 100 of FIG. 1. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the controller 110 and the chirp processing unit 135.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), a Bluetooth® interface, a near field communication (NFC) interface, and/or a PCI express interface. In this example, the interface implements the local oscillator 115 and the chirp generator 130.

In the illustrated example, one or more input devices 1022 are connected to the interface circuit 1020. The input device(s) 1022 permit(s) a user to enter data and/or commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1020 of the illustrated example, thus, typically includes a graphics driver card, a graphics driver chip and/or a graphics driver processor.

The interface circuit 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1026. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, redundant array of independent disks (RAID) systems, and digital versatile disk (DVD) drives.

The machine executable instructions 1032 of FIG. 9 may be stored in the mass storage device 1028, in the volatile memory 1014, in the non-volatile memory 1016, and/or on a removable non-transitory computer readable storage medium such as a CD or DVD.

From the foregoing, it will be appreciated that example methods, apparatus and articles of manufacture have been disclosed that create chirp signals for both transmitting and receiving. The disclosed methods, apparatus and articles of manufacture improve the efficiency of using a computing device by providing flexibility to independently modulate a fixed frequency reference for each Tx/Rx locally. The disclosed methods, apparatus and articles of manufacture enables a radar system to operate more efficiently because of the lowering of the bandwidth and memory requirements from the component circuitry. The disclosed methods, apparatus and articles of manufacture allow for a phase DAC to be implemented in multiple Tx and Rx, which enables a radar system to support different modulations without architecture or circuit redesign. The disclosed methods, apparatus and articles of manufacture are accordingly directed to one or more improvement(s) in the functioning of a computer.

Example methods, apparatus, systems, and articles of manufacture for wideband and fast chirp generation for radar systems are disclosed herein. Further examples and combinations thereof include the following:

Example 1 includes a chirp generator to create chirp signals, the chirp generator comprising a phase digital-to-analog converter (DAC) to convert a digital input that specifies at least one of a phase modulation or a frequency modulation into an analog output, the phase DAC to generate a phase modulated output centered on an intermediate frequency, and a frequency multiplier to frequency multiply the phase modulated output centered on the intermediate frequency by a multiplication factor to generate a chirp signal.

Example 2 includes the chirp generator of example 1, further including a local oscillator receiver to generate a reference clock by dividing a fixed reference frequency by a value.

Example 3 includes the chirp generator of example 1, wherein the phase DAC includes a first DAC to convert a digital quadrature input to an analog current output, a second DAC to convert the digital quadrature input to an analog voltage output, a first filter to generate a first phase modulated signal centered on a low intermediate frequency from the analog current output, a second filter to generate a second phase modulated signal centered on the low intermediate frequency from the analog voltage output, a first mixer to up-convert the first phase modulated signal centered on the low intermediate frequency from the first filter using quadrature mixing and output a first quadrature mixed signal, and a second mixer to up-convert the second phase modulated signal centered on the low intermediate frequency from the second filter using quadrature mixing and output a second quadrature mixed signal.

Example 4 includes the chirp generator of example 3, wherein the first filter is a low pass filter.

Example 5 includes the chirp generator of example 3, wherein the digital quadrature input is a sixteen bit input.

Example 6 includes the chirp generator of example 3, further including a summation circuit that combines the first quadrature mixed signal and the second quadrature mixed signal to provide an output for the phase DAC.

Example 7 includes the chirp generator of example 1, wherein the phase DAC includes a first DAC to convert a digital quadrature input into an analog current output, a second DAC to convert the digital quadrature input into an analog voltage output, a first filter to generate a first phase modulated signal centered on a low intermediate frequency and a second phase modulated signal centered on the low intermediate frequency from the analog current output, a second filter to generate a third phase modulated signal centered on the low intermediate frequency and a fourth phase modulated signal centered on the low intermediate frequency from the analog voltage output, a first mixer to up-convert the first phase modulated signal centered on the low intermediate frequency from the first filter using quadrature mixing and output a first quadrature mixed signal, a second mixer to up-convert the third phase modulated signal centered on the low intermediate frequency from the second filter using quadrature mixing and output a second quadrature mixed signal, a third mixer to up-convert the fourth phase modulated signal centered on the low intermediate frequency from the second filter using quadrature mixing and output a third quadrature mixed signal, and a fourth mixer to up-convert the second phase modulated signal centered on the low intermediate frequency from the first filter using quadrature mixing and output a fourth quadrature mixed signal.

Example 8 includes the chirp generator of example 7, wherein the first filter is a low pass filter.

Example 9 includes the chirp generator of example 7, wherein the digital quadrature input is a sixteen bit input.

Example 10 includes the chirp generator of example 7, further including a summation circuit to combine the first quadrature mixed signal and the second quadrature mixed signal to provide a first quadrature output for the phase DAC.

Example 11 includes the chirp generator of example 10, wherein the summation circuit is a first summation circuit, and further including a second summation circuit to combine the third quadrature mixed signal and the fourth quadrature mixed signal to provide a second quadrature output for the phase DAC.

Example 12 includes the chirp generator of example 1, wherein the phase DAC includes a digital-to-time converter to generate a phase modulated signal.

Example 13 includes the chirp generator of example 1, wherein the phase DAC includes a radio-frequency digital-to-analog converter to generate a phase modulated signal.

Example 14 includes a system to create a chirp signal, the system comprising first means for converting a digital input that specifies at least one of a phase modulation or a frequency modulation into an analog output, means for generating a phase modulated output centered on an intermediate frequency, and means for frequency multiplying the phase modulated output centered on the intermediate frequency by a multiplication factor to generate a chirp signal.

Example 15 includes the system of example 14, further including means for generating a reference clock by dividing a fixed reference frequency by a value.

Example 16 includes the system of example 14, further including second means for converting a digital quadrature input to an analog current output, third means for converting the digital quadrature input to an analog voltage output, first means for generating a first phase modulated signal centered on a low intermediate frequency from the analog current output, second means for generating a second phase modulated signal centered on the low intermediate frequency from the analog voltage output, first means for up-converting the first phase modulated signal centered on the low intermediate frequency from using quadrature mixing and outputting a first quadrature mixed signal, and second means for up-converting the second phase modulated signal centered on the low intermediate frequency from using quadrature mixing and outputting a second quadrature mixed signal.

Example 17 includes the system of example 16, further including means for combining the first quadrature mixed signal and the second quadrature mixed signal.

Example 18 includes the system of example 14, further including second means for converting a digital quadrature input into an analog current output, third means for converting the digital quadrature input into an analog voltage output, first means for generating a first phase modulated signal centered on a low intermediate frequency and a second phase modulated signal centered on the low intermediate frequency from the analog current output, second means for generating a third phase modulated signal centered on the low intermediate frequency and a fourth phase modulated signal centered on the low intermediate frequency from the analog voltage output, first means for up-converting the first phase modulated signal centered on the low intermediate frequency from the first filter using quadrature mixing and outputting a first quadrature mixed signal, second means for up-converting the third phase modulated signal centered on the low intermediate frequency from the second filter using quadrature mixing and outputting a second quadrature mixed signal, third means for up-converting the fourth phase modulated signal centered on the low intermediate frequency from the second filter using quadrature mixing and outputting a third quadrature mixed signal, and fourth means for up-converting the second phase modulated signal centered on the low intermediate frequency from the first filter using quadrature mixing and outputting a fourth quadrature mixed signal.

Example 19 includes the system of example 18, further including first means for combining the first quadrature mixed signal and the second quadrature mixed signal to provide a first output.

Example 20 includes the system of example 18, further including second means for combining third quadrature mixed signal and the fourth quadrature mixed signal to provide a second output.

Example 21 includes the system of example 14, further including first means for generating a phase modulated signal with a digital-to-time converter.

Example 22 includes the system of example 14, further including second means for generating a phase modulated signal with a radio-frequency digital-to-analog converter.

Example 23 includes a method of generating chirp signals and receiving a first chirp signal, the method comprising accessing a digital input representative of a phase modulation for a chirp signal, accessing a fixed reference frequency for a chirp signal, deriving a clock from a division of the fixed reference frequency by a value, synchronizing a clock in a phase DAC to the clock derived from the fixed reference frequency to provide a phase modulated output centered on an intermediate frequency, obtaining a bandwidth expansion for the first chirp signal from the phase modulated output that is frequency multiplied, and outputting the first chirp signal with the bandwidth expansion.

Example 24 includes the method of example 23, further including outputting the first chirp signal with the bandwidth expansion to an antenna.

Example 25 includes the method of example 23, further including outputting the first chirp signal with the bandwidth expansion to a chirp processing unit, wherein the chirp processing unit is to compare the first chirp signal to a second chirp signal.

Although certain example methods, apparatus, and articles of manufacture have been disclosed herein, the scope of coverage of this patent is not limited thereto. On the contrary, this patent covers all methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A chirp generator to create chirp signals, the chirp generator comprising:
    a local oscillator receiver to generate a reference clock by dividing a fixed reference frequency by a value;
    a phase digital-to-analog converter (DAC) to convert a digital input that specifies at least one of a phase modulation or a frequency modulation into an analog output, the phase DAC to generate a phase modulated output centered on an intermediate frequency;
    a frequency multiplier to frequency multiply the phase modulated output centered on the intermediate frequency by a multiplication factor to generate a first chirp signal; and
    a chirp outputter to output the first chirp signal to a chirp processing unit, wherein the chirp processing unit is to compare the first chirp signal to a second chirp signal.

2. The chirp generator of claim 1, wherein the phase DAC includes:
    a first DAC to convert a digital quadrature input to an analog current output;
    a second DAC to convert the digital quadrature input to an analog voltage output;
    a first filter to generate a first phase modulated signal centered on a low intermediate frequency from the analog current output;
    a second filter to generate a second phase modulated signal centered on the low intermediate frequency from the analog voltage output;
    a first mixer to up-convert the first phase modulated signal centered on the low intermediate frequency from the first filter using quadrature mixing and output a first quadrature mixed signal; and
    a second mixer to up-convert the second phase modulated signal centered on the low intermediate frequency from the second filter using quadrature mixing and output a second quadrature mixed signal.

3. The chirp generator of claim 2, wherein the first filter is a low pass filter.

4. The chirp generator of claim 2, wherein the digital quadrature input is a sixteen bit input.

5. The chirp generator of claim 2, further including a summation circuit that combines the first quadrature mixed signal and the second quadrature mixed signal to provide an output for the phase DAC.

6. The chirp generator of claim 1, wherein the phase DAC includes:
    a first DAC to convert a digital quadrature input into an analog current output;
    a second DAC to convert the digital quadrature input into an analog voltage output;
    a first filter to generate a first phase modulated signal centered on a low intermediate frequency and a second phase modulated signal centered on the low intermediate frequency from the analog current output;
    a second filter to generate a third phase modulated signal centered on the low intermediate frequency and a fourth phase modulated signal centered on the low intermediate frequency from the analog voltage output;
    a first mixer to up-convert the first phase modulated signal centered on the low intermediate frequency from the first filter using quadrature mixing and output a first quadrature mixed signal;
    a second mixer to up-convert the third phase modulated signal centered on the low intermediate frequency from the second filter using quadrature mixing and output a second quadrature mixed signal;
    a third mixer to up-convert the fourth phase modulated signal centered on the low intermediate frequency from the second filter using quadrature mixing and output a third quadrature mixed signal; and
    a fourth mixer to up-convert the second phase modulated signal centered on the low intermediate frequency from the first filter using quadrature mixing and output a fourth quadrature mixed signal.

7. The chirp generator of claim 6, wherein the first filter is a low pass filter.

8. The chirp generator of claim 6, wherein the digital quadrature input is a sixteen bit input.

9. The chirp generator of claim 6, further including a summation circuit to combine the first quadrature mixed signal and the second quadrature mixed signal to provide a first quadrature output for the phase DAC.

10. The chirp generator of claim 9, wherein the summation circuit is a first summation circuit, and further including a second summation circuit to combine the third quadrature mixed signal and the fourth quadrature mixed signal to provide a second quadrature output for the phase DAC.

11. The chirp generator of claim 1, wherein the phase DAC includes a digital-to-time converter to generate a phase modulated signal.

12. The chirp generator of claim 1, wherein the phase DAC includes a radio-frequency digital-to-analog converter to generate a phase modulated signal.

13. A system to create a first chirp signal, the system comprising:
   first means for generating a reference clock by dividing a fixed reference frequency by a value;
   first means for converting a digital input that specifies at least one of a phase modulation or a frequency modulation into an analog output, means for generating a phase modulated output centered on an intermediate frequency;
   means for frequency multiplying the phase modulated output centered on the intermediate frequency by a multiplication factor to generate the first chirp signal; and
   means for outputting the first chirp signal to a chirp processing unit, wherein the chirp processing unit is to compare the first chirp signal to a second chirp signal.

14. The system of claim 13, further including:
   second means for converting a digital quadrature input to an analog current output;
   third means for converting the digital quadrature input to an analog voltage output;
   second means for generating a first phase modulated signal centered on a low intermediate frequency from the analog current output;
   third means for generating a second phase modulated signal centered on the low intermediate frequency from the analog voltage output;
   first means for up-converting the first phase modulated signal centered on the low intermediate frequency from using quadrature mixing and outputting a first quadrature mixed signal; and
   second means for up-converting the second phase modulated signal centered on the low intermediate frequency from using quadrature mixing and outputting a second quadrature mixed signal.

15. The system of claim 14, further including means for combining the first quadrature mixed signal and the second quadrature mixed signal.

16. The system of claim 13, further including:
   second means for converting a digital quadrature input into an analog current output;
   third means for converting the digital quadrature input into an analog voltage output;
   second means for generating a first phase modulated signal centered on a low intermediate frequency and a second phase modulated signal centered on the low intermediate frequency from the analog current output;
   third means for generating a third phase modulated signal centered on the low intermediate frequency and a fourth phase modulated signal centered on the low intermediate frequency from the analog voltage output;
   first means for up-converting the first phase modulated signal centered on the low intermediate frequency from the second means for generating the first phase modulated signal using quadrature mixing and outputting a first quadrature mixed signal;
   second means for up-converting the third phase modulated signal centered on the low intermediate frequency from the third means for generating the third phase modulated signal using quadrature mixing and outputting a second quadrature mixed signal;
   third means for up-converting the fourth phase modulated signal centered on the low intermediate frequency from the third means for generating the third phase modulated signal using quadrature mixing and outputting a third quadrature mixed signal; and
   fourth means for up-converting the second phase modulated signal centered on the low intermediate frequency from the second means for generating the first phase modulated signal using quadrature mixing and outputting a fourth quadrature mixed signal.

17. The system of claim 16, further including first means for combining the first quadrature mixed signal and the second quadrature mixed signal to provide a first output.

18. The system of claim 16, further including second means for combining third quadrature mixed signal and the fourth quadrature mixed signal to provide a second output.

19. The system of claim 13, further including second means for generating a phase modulated signal with a digital-to-time converter.

20. The system of claim 13, further including second means for generating a phase modulated signal with a radio-frequency digital-to-analog converter.

21. A method of generating chirp signals and receiving a first chirp signal, the method comprising:
   accessing a digital input representative of a phase modulation for the first chirp signal;
   accessing a fixed reference frequency for a chirp signal;
   deriving a clock from a division of the fixed reference frequency by a value;
   synchronizing a clock in a phase DAC to the clock derived from the fixed reference frequency to provide a phase modulated output centered on an intermediate frequency;
   obtaining a bandwidth expansion for the first chirp signal from the phase modulated output that is frequency multiplied; and
   outputting the first chirp signal with the bandwidth expansion to a chirp processing unit, wherein the chirp processing unit is to compare the first chirp signal to a second chirp signal.

22. The method of claim 21, further including outputting the first chirp signal with the bandwidth expansion to an antenna.

* * * * *